United States Patent [19]
Kusuda

[11] Patent Number: 5,635,410
[45] Date of Patent: Jun. 3, 1997

[54] BIAS TEMPERATURE TREATMENT METHOD

[75] Inventor: Tatsufumi Kusuda, Kyoto, Japan

[73] Assignee: Dainippon Screen Manufacturing Co., Ltd., Japan

[21] Appl. No.: 458,918

[22] Filed: Jun. 2, 1995

[30] Foreign Application Priority Data

Jul. 25, 1994 [JP] Japan .................................. 6-193746

[51] Int. Cl.⁶ .................................................. H01L 21/26
[52] U.S. Cl. ..................... 437/8; 437/171; 437/173; 437/247; 324/765; 250/492.2
[58] Field of Search ..................... 437/170, 171, 437/172, 173, 8, 247; 324/750, 765, 767; 250/492.2

[56] References Cited

U.S. PATENT DOCUMENTS

| | | |
|---|---|---|
| 4,014,772 | 3/1977 | Woods et al. . |
| 4,168,432 | 9/1979 | Williams et al. ........................ 250/370 |
| 4,326,165 | 4/1982 | Szedon . |
| 4,812,756 | 3/1989 | Curtis et al. ........................... 250/492.2 |
| 5,216,362 | 6/1993 | Verkuil ................................... 250/492.2 |
| 5,233,291 | 8/1993 | Kouno et al. . |
| 5,498,974 | 3/1996 | Verkuil et al. .......................... 324/767 |

FOREIGN PATENT DOCUMENTS

| | | |
|---|---|---|
| 54-130882 | 10/1979 | Japan . |
| 55-86121 | 6/1980 | Japan . |
| 59-169956 | 6/1984 | Japan . |
| 60-31905 | 7/1985 | Japan . |
| 60-46665 | 10/1985 | Japan . |
| 63-7635 | 1/1988 | Japan . |

OTHER PUBLICATIONS

M.H. Woods et al., J.Appl. Phys., 44(12)(1973)5506, "Injection and removal of ionic charge at room temperature . . . SiO2" Dec. 1973.

P. Edelman et al., SPIE Proc., 2337 (1994) 154, "New approach to measuring oxide charge and mobile ion concentration" Oct. 1994.

Seiichi Iwamatsu, *Semiconductor Surface Phenomenon*, "Study of Movable Ions (Na+) included in a $SiO_2$ Film", Section 2, pp. 16–51. (university thesis).

*Primary Examiner*—Charles L. Bowers, Jr.
*Assistant Examiner*—Leon Radomsky

[57] ABSTRACT

The time and labor required for bias temperature (BT) treatment of a semi-conductor wafer is reduced by utilizing apparatus in which turning a switch 40 on connects a first d.c. power source 30 to apply a positive high voltage between a first wire 20 and a semiconductor wafer 100 while a second d.c. power source 32 applies a negative high voltage between a second wire 22 and the semiconductor wafer 100. This results in positive corona discharge between the first wire 20 and the semiconductor wafer 100 and negative corona discharge between the second wire 22 and the semiconductor wafer 100. After cessation of corona discharge, the semiconductor wafer 100 is heated to a high temperature for a predetermined time period with a heater 120 embedded in a stage 110 that supports the wafer that is being treated.

4 Claims, 12 Drawing Sheets

Fig. 1

PRIOR ART

BIAS TEMPERATURE TREATMENT METHOD

BACKGROUND OF THE INVENTION

1. Field of the Invention

The present invention relates to an apparatus and a method for executing bias temperature (BT) treatment on semiconductor wafers.

2. Description of the Related Art

In a wafer process wherein movable ions, such as sodium ions (Na$^+$), are added into an insulating film formed on the surface of a semiconductor wafer gradual movement of the movable ions by an electric field lowers stability at the surface of the semiconductor wafer.

The quantity of movable ions in the insulating film is generally determined by BT treatment and C-V (capacity-voltage) measurement.

Conventional BT treatment is executed by applying a d.c. (direct current) bias to an electrode formed on part of an insulating film of a semiconductor wafer under high temperature condition.

Figure 1:
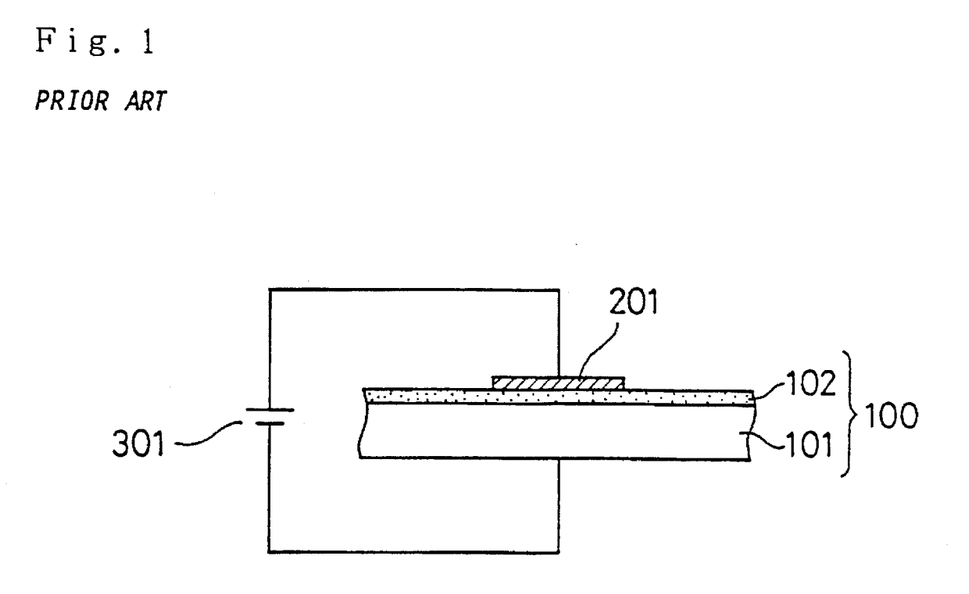
FIG. 1 is a schematic view showing the method of the conventional BT treatment as described above.

FIG. 1 shows a method of conventional BT treatment, where an electrode 201 is formed on an insulating film 102 of a semiconductor of wafer 100 through vapor deposition of a metal like aluminum (AL). A d.c. power source 301 applies a d.c. bias between the electrode 201 and a semiconductor substrate 101 of the semiconductor wafer 100. The d.c. bias is while the semiconductor wafer 100 is at a high temperature to allow movement of movable ions that are present in the insulating film 102. When the temperature of the semiconductor wafer 100 decreases, the movable ions moving in the insulating film 102 are bound to their new positions. Conventional C-V measurement is then performed by applying an a.c. (alternating current) voltage between the electrode 201 and the semiconductor substrate 101 of the BT-treated semiconductor wafer 100.

The quantity of movable ions is determined in the following manner through the conventional BT treatment and C-V measurement.

Figure 3A:
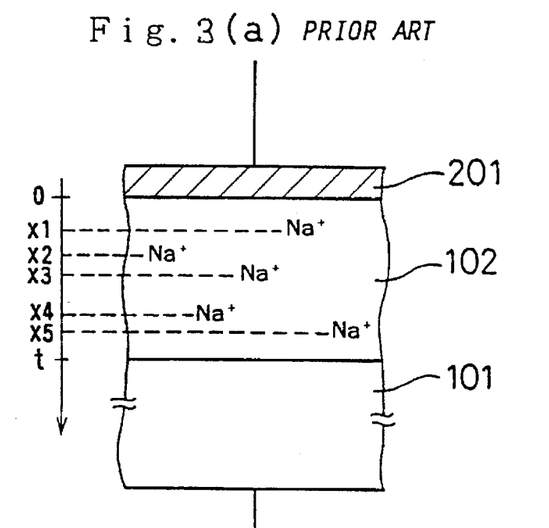
FIGS. 3(a) through 3(c) are schematic views illustrating movements of sodium ions under the condition of BT treatment according to the method shown in FIG. 1, as explained above.
Figure 3B:
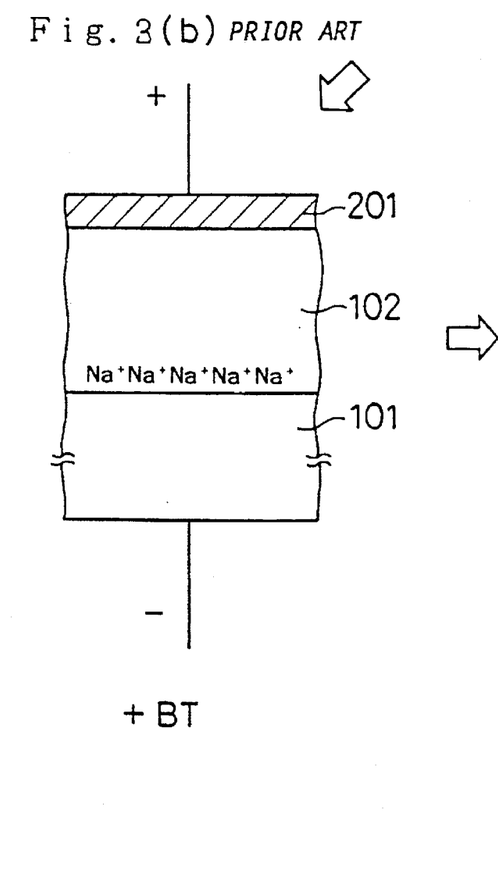
Figure 3C:
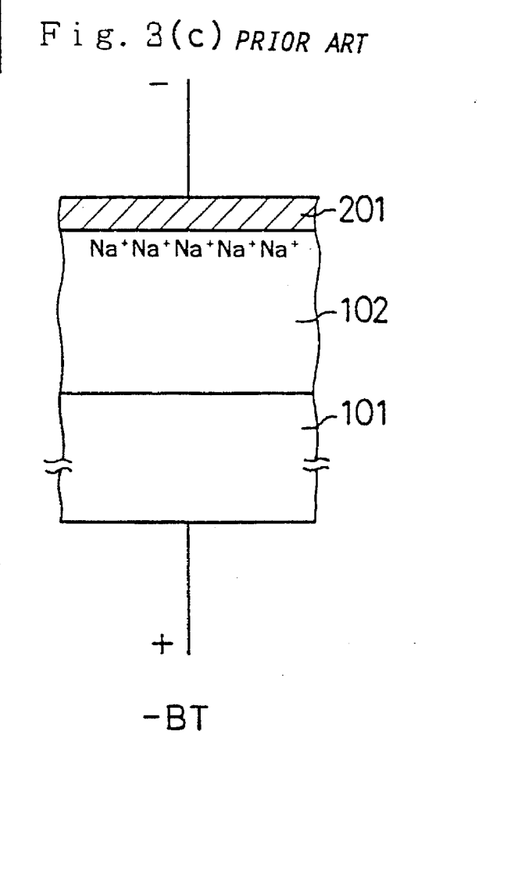

FIGS. 3(a), 3(b), and 3(c); show movement of sodium ions (movable ions) under the condition of BT treatment according to the method of FIG. 1.

BT treatment is executed while the positive terminal of the d.c. power source 301 is connected to the electrode 201 and the negative terminal of source 301 is connected to the semiconductor substrate 101 as shown in FIG. 1. Sodium ions existing at random positions in the insulating film 102 as shown in FIG. 3(a) start moving in the insulating film 102 to be attracted to the negative side, that is, toward the semiconductor substrate 101 as shown in FIG. 3(b). Such BT treatment is hereinafter referred to as '+BT treatment'.

When the temperature of the semiconductor wafer 100 decreases, the sodium ions are bound to their positions shown in FIG. 2(b). C-V measurement is then executed under the condition of FIG. 3(b).

BT treatment is then executed while the positive and negative terminals of the d.c. power source 301 are connected to the semiconductor substrate 101 and the electrode 201, respectively, contrary to the case shown in FIG. 1. The sodium ions bound to the positions shown in FIG. 3(b) start moving again in the insulating film 102 to be attracted to the negative side, that is, toward the electrode 201 as shown in FIG. 3(c). Such BT treatment is hereinafter referred to as '−BT treatment'.

As the temperature of the semiconductor wafer 100 decreases, the sodium ions are bound to their positions shown in FIG. 3(c). C-V measurement is then executed under the condition of FIG. 3(c).

Figure 2:
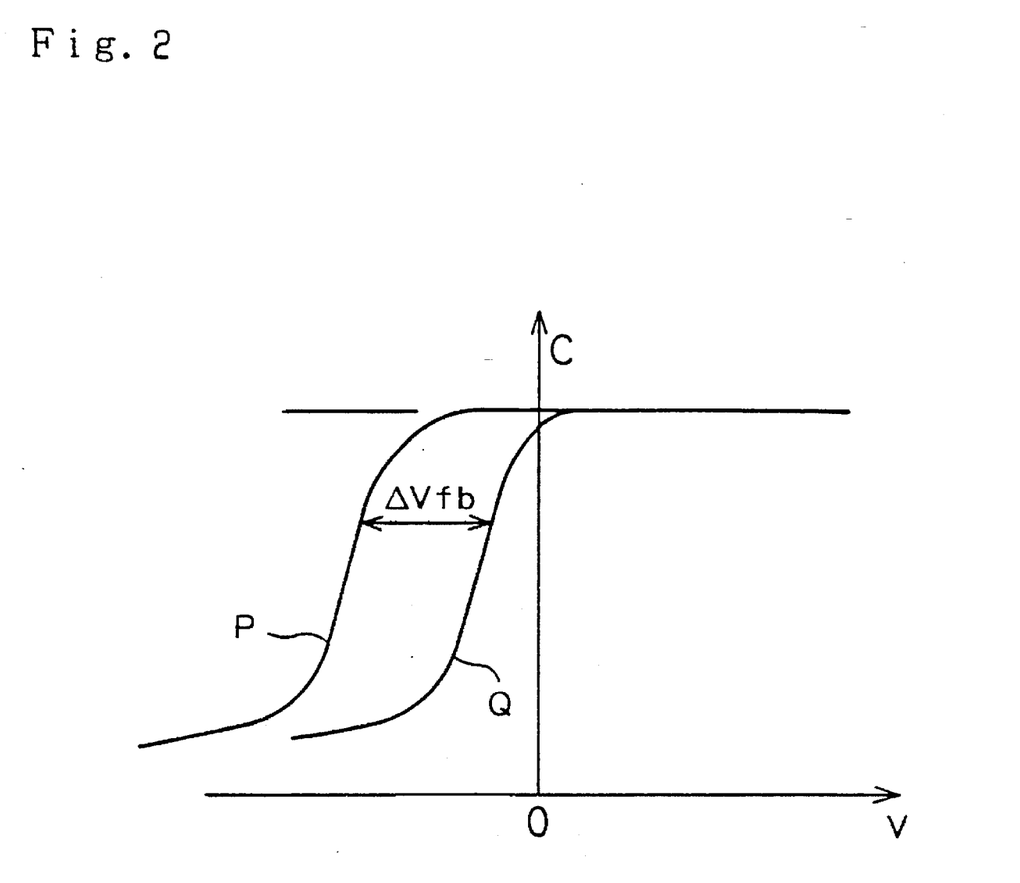
FIG. 2 is a characteristic chart showing results of C-V measurement on the semiconductor wafer after +BT treatment and −BT treatment, as described above.

FIG. 2 is a characteristic chart showing results of C-V measurement on the semiconductor wafer after +BT treatment and −BT treatment.

A C-V curve obtained by C-V measurement shifts from an ideal C-V curve along the voltage axis due to various causes. One of the causes is presence of movable ions, such as, sodium ions, in the insulating film.

A shift of flatband voltage due to movable ions in the insulating film is obtained as below. When movable ions (sodium ions) have charge density $\rho(x)$ in the insulating film 102 at a position x, where x is a distance from a boundary between the electrode 201 and the insulating film 102 as shown in FIG. 3(a), the shift of flatband voltage is given as an integral of a function $x\rho(x)$, that is, $-x\rho(x) \, dx$.

under the condition of −BT treatment, all the movable ions (sodium ions) are positioned close to the electrode 201 as shown in FIG. 3(c). Therefore the drift of flatband voltage obtained as a result of integration becomes equal to zero. The C-V curve under the condition of −BT treatment is given as a curve Q shown in FIG. 2.

Under the condition of +BT treatment, on the other hand, all the movable ions (sodium ions) are positioned close to the semiconductor substrate 101 as shown in FIG. 3(b). Therefore the shift of flatband voltage is substantially equal to $t\rho(t)$, where t is a thickness of the insulating film 102. Since the thickness t of the insulating film 102 is a known value, the charge density $\rho(t)$ is obtained from the shift of flatband voltage $t\rho(t)$. Further the quantity of movable ions can be calculated from the charge density $\rho(t)$. The C-V curve under the condition of +BT treatment is given as a curve P shown in FIG. 2.

Since the shift of flatband voltage under the condition of −BT treatment is equal to zero as described above, the shift of flatband voltage from an ideal C-V curve under the condition of +BT treatment is obtained as a difference $\Delta Vfb$ between the C-V curve Q in −BT treatment and the C-V curve P in +BT treatment shown in FIG. 2.

As described previously, the conventional method of BT treatment uses a semiconductor wafer having an electrode formed on part of an insulating film thereof, thus requiring a time-consuming and labor-consuming process of forming the electrode on the semiconductor wafer through vapor deposition of a metal film, prior to BT treatment.

The conventional method of BT treatment executes −BT treatment after +BT treatment (or +BT treatment after −BT treatment), thus taking a relatively long time.

SUMMARY OF THE INVENTION

The instant object of the invention is thus to reduce the time and labor required for BT treatment.

In order to realize the above and the other related objects, this invention is directed to a BT treatment apparatus for executing bias temperature treatment on a semiconductor wafer, the BT treatment apparatus including; support means for supporting the semiconductor wafer; a first wire and a second wire respectively arranged to be apart from a surface of the semiconductor wafer supported by the support means; corona discharge means for causing positive corona discharge between the first wire and the semiconductor wafer and negative corona discharge between the second wire and the semiconductor wafer, to thereby form a region of positive charges and a region of negative charges on the surface of the semiconductor wafer through the positive corona discharge and the negative corona discharge, respectively; and heating means for heating the semiconductor wafer.

The apparatus of this invention implements BT treatment by accumulating electric charges on the surface of the semiconductor wafer through corona discharge. This structure does not require any electrode, to be formed on part of an insulating film of the semiconductor wafer, as in the conventional BT treatment system, thereby reducing the time and labor required for a step of vapor deposition of a metal film on the semiconductor wafer prior to BT treatment. The apparatus of the instant invention conducts BT treatment by heating the semiconductor wafer with the heating means while positive charges and negative charges are accumulated respectively in specific regions on the surface of the semiconductor wafer. The invention can thus implement +BT treatment and −BT treatment simultaneously. Compared with the conventional system where −BT treatment is conducted after +BT treatment or vice versa, the instant invention significantly saves the time required for +BT treatment and −BT treatment. Further, apparatus of the instant invention accurately determines the quantity of movable ions in the insulating film of the semiconductor wafer without being influenced by moisture and impurities adhering to the surface of the semiconductor wafer during a time period between BT treatment and C-V measurement.

According to one preferred application, the corona discharge means includes: a first d.c. power source for applying a positive d.c. voltage between the first wire and the semiconductor wafer to cause a positive corona discharge between the first wire and the semiconductor wafer; and a second d.c. power source for applying a negative d.c. voltage between the second wire and the semiconductor wafer to cause a negative corona discharge between the second wire and the semiconductor wafer. Application of d.c. voltages between the first wire and the semiconductor wafer and between the second wire and the semiconductor wafer by means of the two d.c. power sources results in positive corona discharge occurring between the first wire and the semiconductor wafer and negative corona discharge between the second wire and the semiconductor wafer.

According to another preferred application, the corona discharge means includes: a d.c. power source for generating a d.c. voltage; and switching means for switching between first and second switching positions, the first switching position applying the d.c. voltage generated by the d.c. power source as a positive d.c. voltage between the first wire and the semiconductor wafer, to cause a positive corona discharge between the first wire and the semiconductor wafer, the second switching position applying the d.c. voltage generated by the d.c. power source as a negative d.c. voltage between the second wire and the semiconductor wafer to cause a negative corona discharge between the second wire and the semiconductor wafer. This structure alternately applies a d.c. voltage between the first wire and the semiconductor wafer, and between the second wire and the semiconductor wafer by means of the common d.c. power source to cause positive corona discharge between the first wire and the semiconductor wafer and negative corona discharge between the second wire and the semiconductor wafer. This structure requires fewer parts including only one d.c. power source, compared with the apparatus having two d.c. power sources.

According to still another preferred application, the corona discharge means includes a d.c. power source for applying a d.c. voltage between the first wire and the second wire to simultaneously cause a positive corona discharge between the first wire and the semiconductor wafer and a negative corona discharge between the second wire and the semiconductor wafer. This structure applies a d.c. voltage between the first wire and the second wire by means of the common d.c. power source to simultaneously cause positive corona discharge between the first wire and the semiconductor wafer and negative corona discharge between the second wire and the semiconductor wafer. This structure also requires fewer parts including only one d.c. power source, compared with the apparatus having two d.c. power sources. The space between the first wire and the semiconductor wafer and that space between the second wire and the semiconductor wafer exist in the same closed circuit loop and accordingly have equivalent current densities. This means that the density of negative charges becomes substantially equal to the density of positive charges. Adjustment of the voltage of the d.c. power source and the distance between the first wire and the surface of the semiconductor wafer in order to restrict the density of positive charges within a predetermined allowable range, naturally sets the density of negative charges within the predetermined allowable range. The apparatus of this structure does not require any specific adjustment for restricting the density of negative charges within the predetermined allowable range, thus eliminating the time and labor that is expended when such an adjustment is made.

In another aspect of the present invention, there is provided a method of executing bias temperature treatment on a semiconductor wafer, the method including the steps of: (a) supporting the semiconductor wafer at a predetermined position; (b) arranging a first wire and a second wire respectively to be above and spaced from a surface of the semiconductor wafer; (c) generating positive corona discharge between the first wire and the semiconductor wafer and negative corona discharge between the second wire and the semiconductor wafer, to thereby form a region of positive charges and a region of negative charges on the surface of the semiconductor wafer through the positive corona discharge and the negative corona discharge, respectively; and (d) heating the semiconductor wafer.

These and other objects, features, aspects, and advantages of the present invention will become more apparent from the following detailed description of the preferred embodiments illustrated in the accompanying drawings.

DETAILED DESCRIPTION OF THE PREFERRED EMBODIMENTS

The BT treatment apparatus of the first embodiment (FIG. 4) includes a conductive stage 110, first and second wires 20 and 22, and first and second d.c. (direct current) power sources 30 and 32. A heater 120 is embedded in the conductive stage 110 to be electrically insulated from the stage 110. A semiconductor wafer 100 mounted on the stage 110 is sucked onto the stage 110 by means of a vacuum pump (not shown) and electrically connected with the stage 110.

Figure 4:
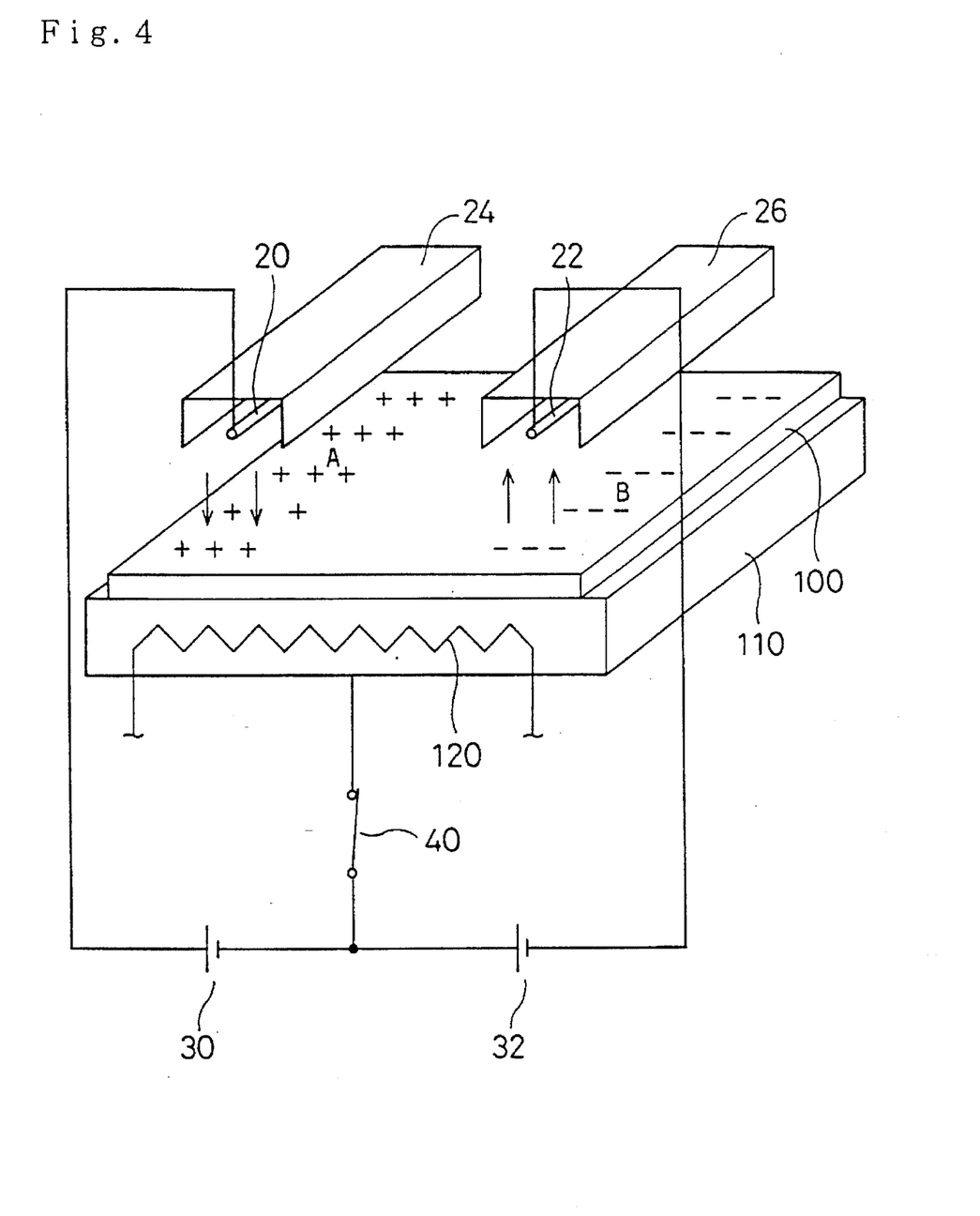
FIG. 4 is a conceptual perspective illustrating a BT treatment apparatus of a first embodiment according to the instant invention.

The first wire 20 and the second wire 22 having conductivity are arranged above the semiconductor wafer 100 to be substantially parallel to the surface of the semiconductor wafer 100 and to be substantially equally spaced from the surface of the semiconductor wafer 100. A first shield case 24, which is disposed to surround the first wire 20, except the bottom side thereof, shields the top and both sides of the first wire 20. A second shield case 26 shields the top and both sides of the second wire 22. Each of the first and the second shield cases 24 and 26 has an open bottom and two open ends corresponding to the ends of the respective wires 20, 22.

One end of the first wire 20 is coupled to a positive terminal of the first d.c. power source 30 via a connection line, while the other end of first wire 20 is free. Likewise, one end of the second wire 22 is coupled to a negative terminal of the second d.c. power source 32 via a connection line, while the other end of second wire 22 is free.

A negative terminal of the first d.c. power source 30 and a positive terminal of the second d.c. power source 32 are commonly connected to one end of a switch 40 via connection lines, whereas the other end of the switch 40 is coupled to a rear face of the stage 110. The first d.c. power source 30 and the second d.c. power source 32 supply identical d.c. voltages.

According to the flowchart of FIG. 5, semiconductor wafer 100 is subjected to a method of BT treatment with the BT treatment apparatus shown in FIG. 4 as follows. At step 1, the semiconductor wafer 100 is mounted and securely supported on the front of stage 110. In step 2 the first wire 20 and the second wire 22 are then positioned to be equally spaced from the front surface of the semiconductor wafer 100, by a predetermined distance.

The routine then goes to step 3 at which the switch 40 is turned on (closed) as shown in FIG. 4, where the first d.c. power source 30 applies the positive high voltage between the first wire 20 and the semiconductor wafer 100 while the second d.c. power source 32 applies the negative high voltage between the second wire 22 and the semiconductor wafer 100. Application of these voltages causes a positive corona discharge between the first wire 20 and the semiconductor wafer 100 and a negative corona discharge between the second wire 22 and the semiconductor wafer 100. After a predetermined time period has elapsed, the switch 40 is turned off (opened) to stop the corona discharge.

This results in accumulation of positive charges in a region A below the first wire 20 and negative charges in a region B below the second wire 22 on the surface of the semiconductor wafer 100, as illustrated in FIG. 4.

The corona discharge is a continuous discharge by local dielectric breakdown of the air in a heterogeneous electric field. A process utilizing the apparatus of FIG. 4 for accumulating charges on the surface of the semiconductor wafer 100, especially in region A, by corona discharge is explained with reference to FIGS. 6(a) through 6(c).

Figure 6A:
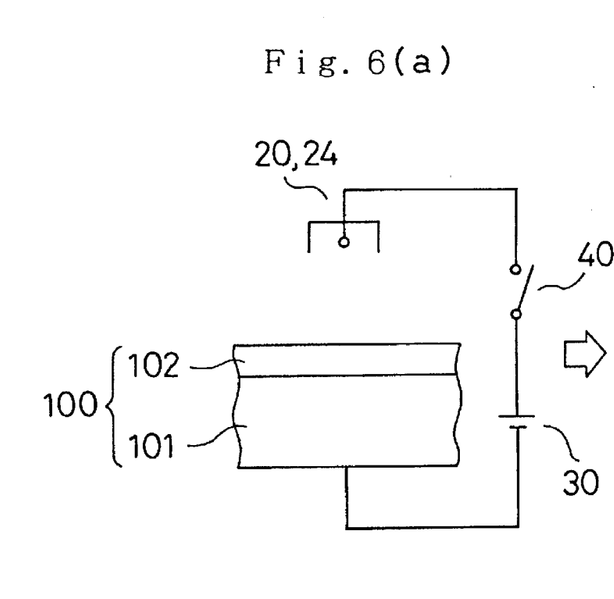
FIGS. 6(a) through 6(c) are schematics that illustrate how a corona discharge works to accumulate electric charges on the surface of the semiconductor wafer 100 shown in FIG. 4.
Figure 6B:
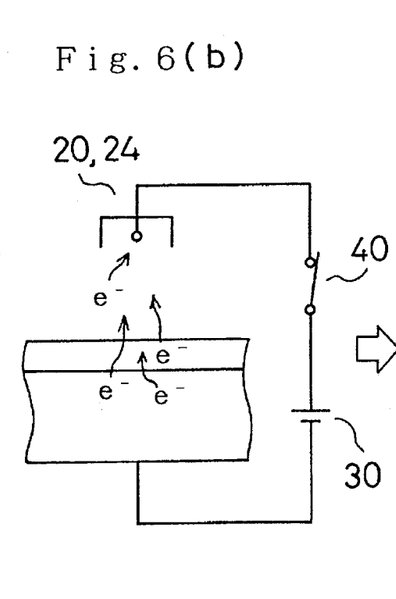
Figure 6C:
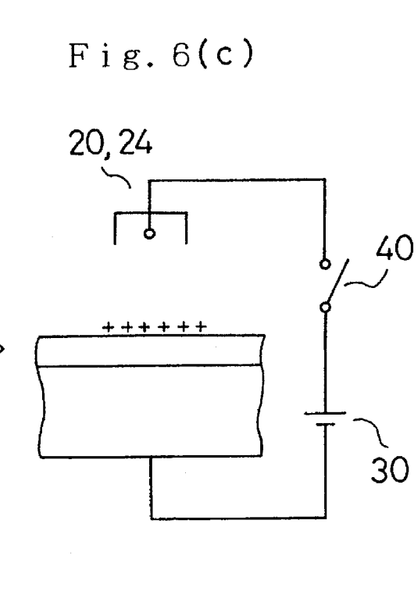

These FIGS. 6(a), 6(b), and 6(c) respectively illustrate conditions before, during, and after the corona discharge.

Prior to the corona discharge, the whole semiconductor wafer 100 is electrically neutral as shown in FIG. 6(a). During the corona discharge shown in FIG. 6(b), electrons are discharged from a semiconductor substrate 101 to the air via an insulating film 102 and flow toward the first wire 20. This results in positive charges being left on the insulating film 102. After the corona discharge, positive charges accordingly gather on the insulating film 102 as shown in FIG. 6(c). While positive charges are accumulated on the surface of the region A (FIG. 4) of the semiconductor wafer 100 according to the process shown in FIGS. 6(a) through 6(c), negative charges are accumulated in a similar process (not illustrated) on the insulating film 102 or the surface of the region B of the semiconductor wafer 100 (see FIG. 4) after the corona discharge.

Figure 5:
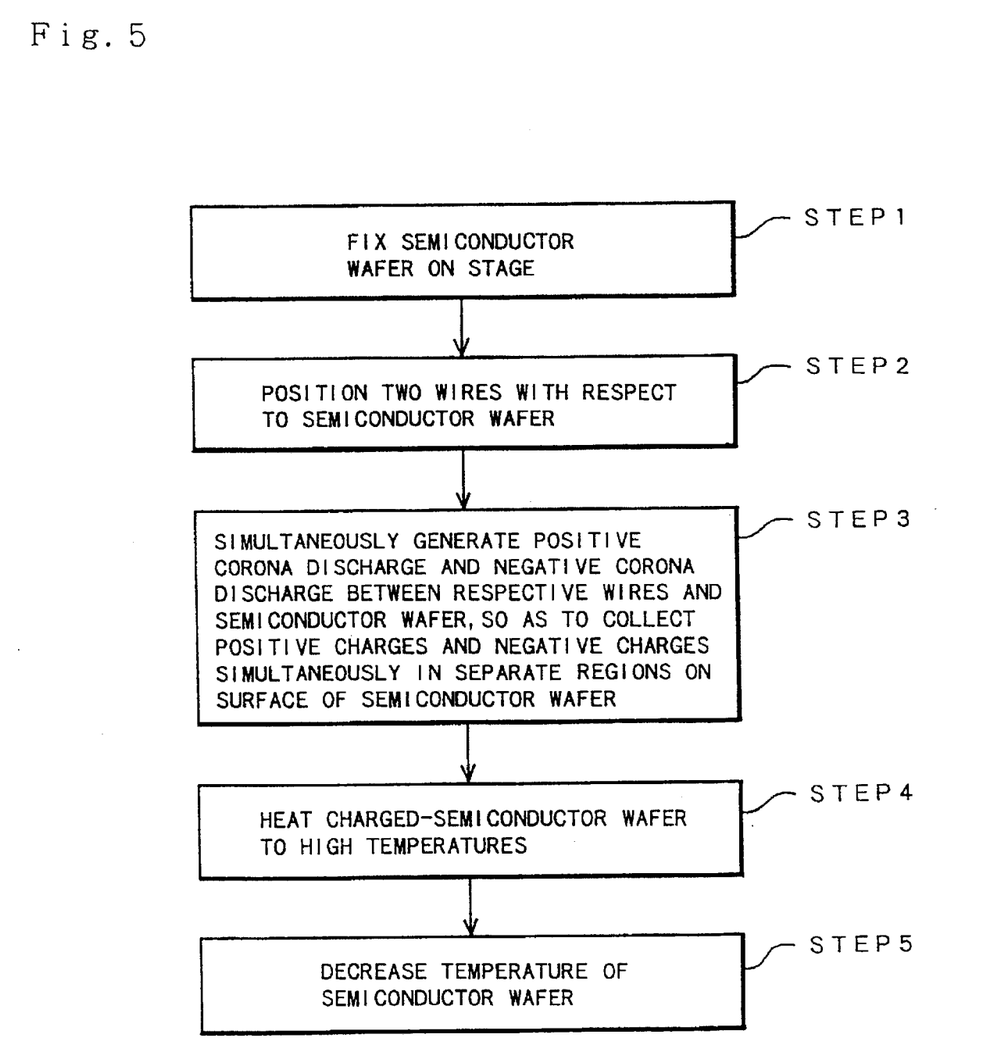
FIG. 5 is a flowchart of a BT treatment routine carried out with the BT treatment apparatus shown in FIG. 4.

At step 4 in the flowchart of FIG. 5, the semiconductor wafer 100 is heated to a high temperature for a predetermined time period with the heater 120 embedded in the stage 110 as shown in FIG. 4. The program then proceeds to step 5 at which the application of heat to the semiconductor wafer 100 by the heater 120 is discontinued and the semiconductor wafer 100 is cooled down to room temperature.

Figure 7A:
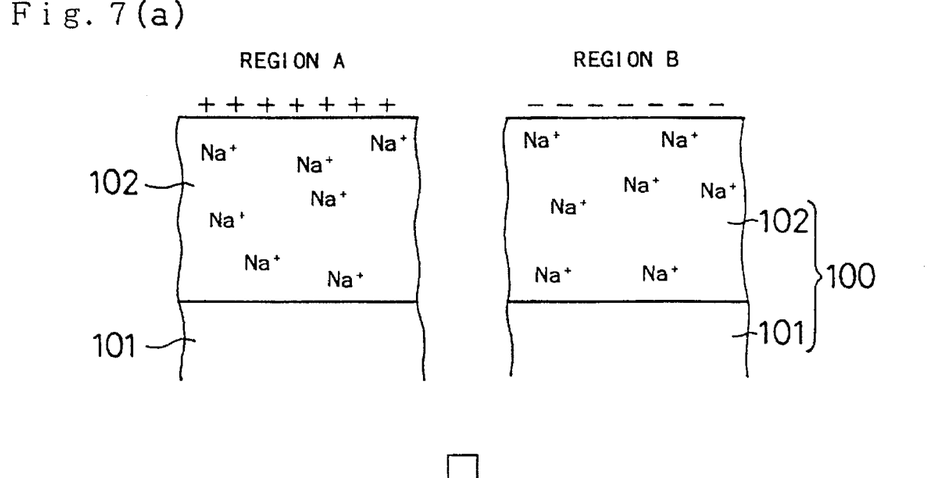
FIGS. 7(a) through 7(c) are schematics that illustrate movement of movable ions in an insulating film resulting from a BT treatment with the BT treatment apparatus shown in FIG. 4.
Figure 7B:
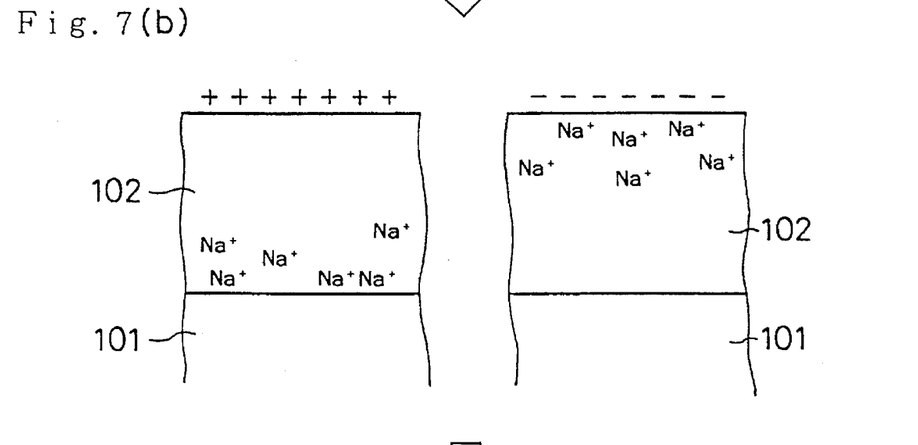
Figure 7C:
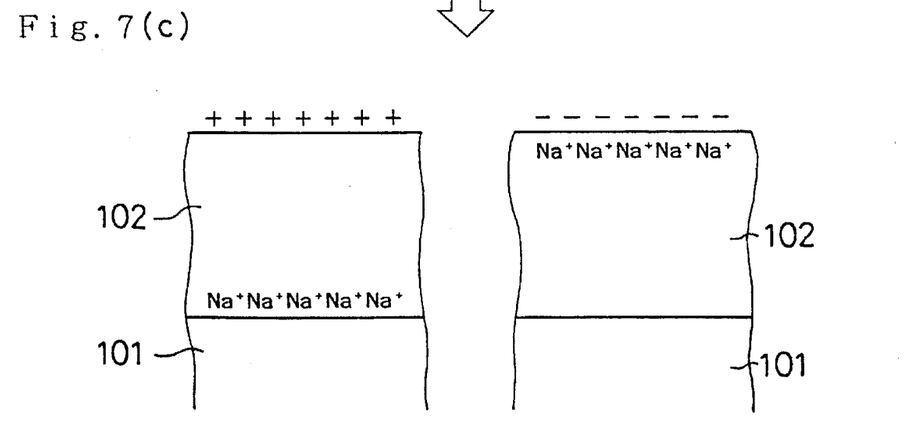

Movement of the movable ions in the insulating film 102 are explained with reference to FIGS. 7(a) through 7(c) which illustrates movements of the movable ions in the insulating film under the condition of BT treatment with the BT treatment apparatus shown in FIG. 4. The left hand sides of FIGS. 7(a) through 7(c) illustrate motions of the movable ions in the region A of the semiconductor wafer 100 shown in FIG. 4 and the right hand sides gives the same in the region B of the semiconductor wafer 100. In the drawings of FIGS. 7(a) through 7(c), the movable ions in the insulating film 102 are represented by sodium ions.

After completion of the corona discharge at step 3 in the BT treatment routine described above, positive charges gather on the insulating film 102 in the region A and negative charges in the region B as shown in FIG. 7(a). Sodium ions exist at random in the insulating film 102. While the temperature of the semiconductor wafer 100 is approximately equal to room temperature, however, sodium ions cannot move freely in the insulating film 102 but are bound to their positions.

When the semi-conductor wafer 100 is heated to the high temperature at step 4, sodium ions start moving in the insulating film 102. As illustrated in FIG. 7(b), positive charges gather on the insulating film 102 and sodium ions repel the positive charges to move away from the positive charges in the region A, while negative charges are present on the insulating film 102 and sodium ions are attracted to the negative charges to move toward the negative charges in the region B. Eventually most of sodium ions in the insulating film 102 gather close to a boundary between the insulating film 102 and the semiconductor substrate 101 in the region A and close to a boundary between the insulating film 102 and the atmosphere in the region B as illustrated in FIG. 7(c).

When the semiconductor wafer 100 is cooled down to room temperature at step 5, sodium ions in the insulating film 102 are bound to their positions shown in FIG. 7(c).

This results in +BT treatment in the region A and −BT treatment in the region B. The BT treatment apparatus shown in FIG. 4 can implement +BT and −BT treatments simultaneously.

Since the BT treatment apparatus of the first embodiment implements BT treatment by accumulating electric charges on the surface of the semiconductor wafer 100 through corona discharge, it structure does not require an electrode to be formed on an insulating film of a semiconductor wafer, thereby reducing the time and labor that would be required for forming such an electrode on a semiconductor wafer prior to the BT treatment.

The BT treatment apparatus of the first embodiment carries out BT treatment by heating the semiconductor wafer 100 with the heater 120 while positive charges in the region A and negative charges in the region B are accumulated on the surface of the semiconductor wafer 100. Thus, the BT treatment apparatus of the first embodiment implements +BT treatment and −BT treatment simultaneously. Compared with conventional systems where −BT treatment and +BT treatment are conducted in sequence, the BT treatment apparatus of the first embodiment herein significantly saves the time required for +BT treatment and −BT treatment. Simultaneous occurrence of positive corona discharge and negative corona discharge further reduces the time of BT treatment.

There are other advantages of simultaneous +BT treatment and −BT treatment. That is, in BT treatment through accumulation of electric charges on the surface of the semiconductor wafer 100, the BT-treated region on the surface of the semiconductor wafer 100 is always exposed to the atmosphere. If −BT treatment were performed for C-V measurement after completion of C-V measurement on the +BT-treated region of the semiconductor wafer 100, moisture and impurities in the air would adhere to the surface of the semiconductor wafer 100 during a time period between the +BT treatment and C-V measurement and during a time period between −BT treatment and C-V measurement, alike. Since the time period between +BT treatment and C-V measurement would be different from that between −BT treatment and C-V measurement, different quantities of moisture and impurities and types of impurities would adhere to the surface of the semiconductor wafer 100 during the respective time periods.

On the other hand, in apparatus of the embodiment attaining the simultaneous +BT treatment and −BT treatment, even when moisture and impurities adhere to the surface of the semiconductor wafer 100 before the C-V measurement, there is no significant difference in quantities of moisture and impurities and types of impurities between the +BT-treated region and the −BT-treated region. This means that moisture and impurities in the air affect the +BT-treated region and the −BT-treated region equally. The quantity of movable ions in the insulating film 102 of the semiconductor wafer 100 is determined by the difference between the C-V curve in −BT treatment and the C-V curve in +BT treatment, as described previously. This calculation compensates for the influence of moisture and impurities in the +BT-treated region with that of the −BT-treated region. Thus, the BT treatment apparatus of embodiment determines the quantity of movable ions in the insulating film 102 of the semiconductor wafer 100 accurately, not being affected by moisture and impurities adhering to the surface of the semiconductor wafer 100.

Two methods applicable to C-V measurement of the BT-treated semiconductor wafer 100 are briefly described below. C-V measurement can be performed separately for the +BT-treated region and the −BT-treated region on the semiconductor wafer 100.

The first method is non-contact C-V measurement, where an electrode is disposed above and spaced from a semiconductor wafer by a predetermined distance, preferably about 1 micrometer, and an a.c. (alternating current) voltage is applied between the electrode and the semiconductor wafer for C-V measurement. Such technique is disclosed, for example, in U.S. Pat. No. 5,233,291, the disclosure of which is incorporated herein by reference.

The second method is C-V measurement using a liquid metal as an electrode, where a Cu probe with a liquid metal such as Hg or In-Ga alloy attached to one end thereof is pressed against the surface of a semiconductor wafer (that is, the surface of the insulating film) as an electrode and an a.c. voltage is applied between the electrode and the semiconductor wafer for C-V measurement.

These methods allow C-V measurement without forming any additional electrode on an insulating film of a semiconductor wafer through vapor deposition of a metal film. As a result, these methods do not require a time and labor consuming process of forming an electrode on an insulating film through vapor deposition, but realize C-V measurement of the semiconductor wafer 100 immediately after BT treatment with the BT treatment apparatus of the instant invention.

The structure of the BT treatment apparatus according to the embodiment will now be described with reference to the accompanying drawings particularly, FIG. 8 which is a cross section illustrating a concrete structure of the BT treatment apparatus shown in FIG. 4, and FIG. 9 which is a cross section taken on the line IX—IX of FIG. 8.

Figure 8:
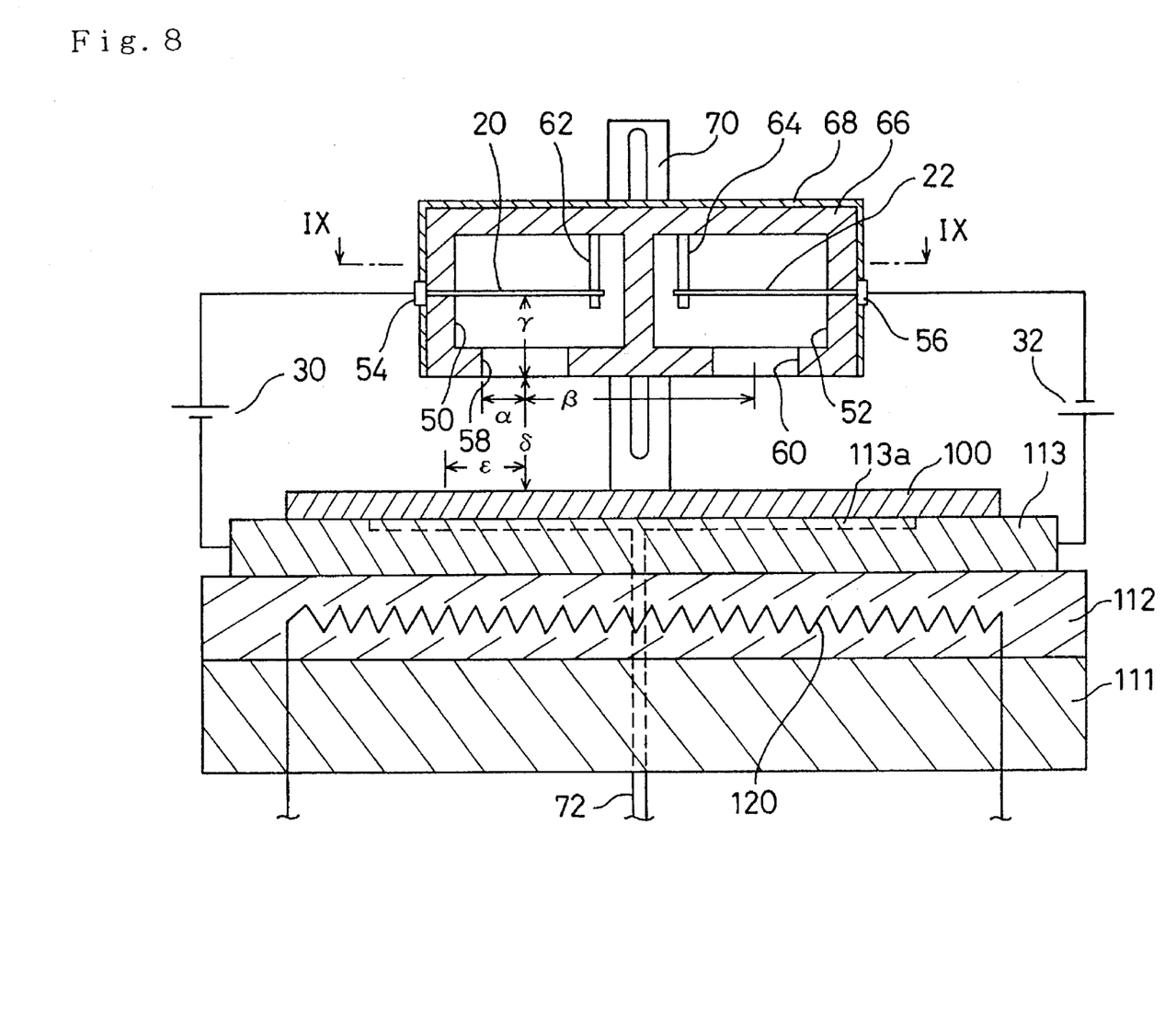
FIG. 8 is a cross section taken through a physical embodiment of the BT treatment apparatus shown in FIG. 4.

Referring to FIG. 8, the stage 110 shown in FIG. 4 includes a base 111, a heating plate 112 mounted on the base 111, and a suction plate 113 further mounted on the heating plate 112. The heater 120 is embedded in the heating plate 112. The semiconductor wafer 100 is mounted on the suction plate 113, which has a groove 113a formed on the top face thereof. The groove 113a is joined to a pipe 72 which passes through the suction plate 113, the heating plate 112, and the base 111 and connects with a vacuum pump (not shown). The semiconductor wafer 100 mounted on the suction plate 113 is sucked onto the suction plate 113 through operation of the vacuum pump.

An upright guide 70 is vertically disposed on the base 111. A wire case 66 composed of an acrylic resin is engaged with the guide 70 to allow vertical movement of the wire case 66. The wire case 66 is driven by a motor (not shown) to shift along the guide 70 in the vertical direction.

The wire case 66 includes first and second chambers 50 and 52 of rectangular parallelepiped. Circular apertures 58 and 60 are formed on the bottom faces of the respective chambers 50 and 52 as illustrated in FIG. 9. Each radius $\alpha$ of the apertures 58 and 60 is 5 mm, and a distance $\beta$ between centers of the apertures 58 and 60 is 30 mm.

U-shaped first and second wires 20 and 22 run above the first and the second apertures 58 and 60 across the first and the second chambers 50 and 52, respectively. Wire 20 and 22 have one ends passing through side walls to be coupled with terminals 54 and 56, the other ends joined with one ends of springs 74 and 76, and the middles of the wires are supported by support bars 62 and 64 protruding from the ceiling of each chamber 50 and 52, respectively. The springs 74 and 76 are fixed to the side walls on their residual ends to give tensions to the wires 20 and 22. The wires 20 and 22 are made of tungsten and have a diameter of approximately 80 micrometer. A distance γ from the bottom face of the wire case 66 to each wire 20 and 22 is 3 mm.

An aluminum shield case 68 surrounds the wire case 66 to be insulated from the terminals 54 and 56.

The suction plate 113 is composed of a metal like aluminum or copper and electrically connected with the negative terminal of the first d.c. power source 30 and the positive terminal of the second d.c. power source 32. The positive terminal of the first d.c. power source 30 is electrically connected with the terminal 54 mounted on an outer face of the wire case 66, and the negative terminal of the second d.c. power source 32 with the terminal 56. The switch 40 shown in FIG. 4 is omitted from the drawing of FIG. 8.

Figure 9:
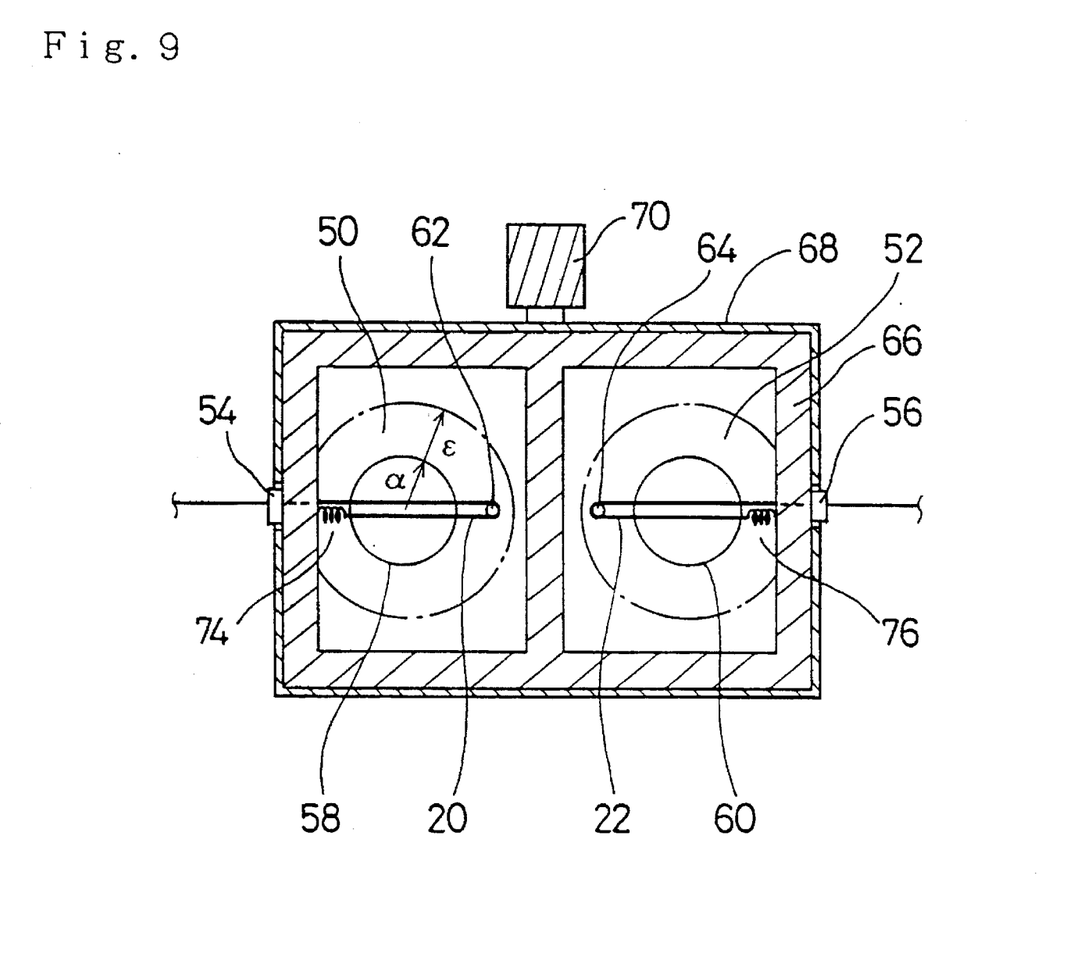
FIG. 9 is a cross section taken through line IX—IX of FIG. 8 looking in the direction of arrows IX—IX.

A typical method of BT treatment on the semiconductor wafer 100 with the BT treatment apparatus shown in FIGS. 8 and 9 are briefly described below.

The semiconductor wafer 100 is set in the BT treatment apparatus in the following manner. The wire case 66 is driven by a motor (not shown) to move up to a rest position, and the semiconductor wafer 100 is mounted and sucked onto the suction plate 113. The wire case 66 is again driven by the motor to move down to a predetermined measurement position where the bottom face of the wire case 66 is apart from the surface of the semiconductor wafer 100 by a predetermined distance δ (for example, 6 mm).

The first d.c. power source 30 is then activated to apply a positive high voltage between the first wire 20 and the semiconductor wafer 100, while the second d.c. power source 32 applies a negative high voltage between the second wire 22 and the semiconductor wafer 100. The high voltage applied is a d.c. voltage of 4 through 7 kV and the time of application is several to several tens seconds.

As a result, positive charges gather immediately below the first aperture 58 on the surface of the semiconductor wafer 100 (that is, on the surface of the insulating film 102), and negative charges immediately below the second aperture 60. Each charged region has a circular area (area surrounded by a one-dot chain line in FIG. 9) of a radius ε (approximately 10 mm) around a point corresponding to the center of each aperture 58 and 60. The surface potential of each charged region is approximately 5 volts, provided that the thickness of the insulating film 102 is 1,000 angstroms.

The semiconductor wafer 100 under the charged condition is heated with the heater 120 embedded in the heating plate 112. The preferable heating temperature ranges from 250° to 300° C. and heating time is about 30 minutes or less. After the heating procedure, the semiconductor wafer 100 is forcibly cooled down to room temperature, which concludes the BT treatment with the BT treatment apparatus shown in FIGS. 8 and 9.

A second embodiment according to the invention is described with reference to FIG. 10, which is a perspective illustrating conceptually a BT treatment apparatus of the second embodiment.

Figure 10:
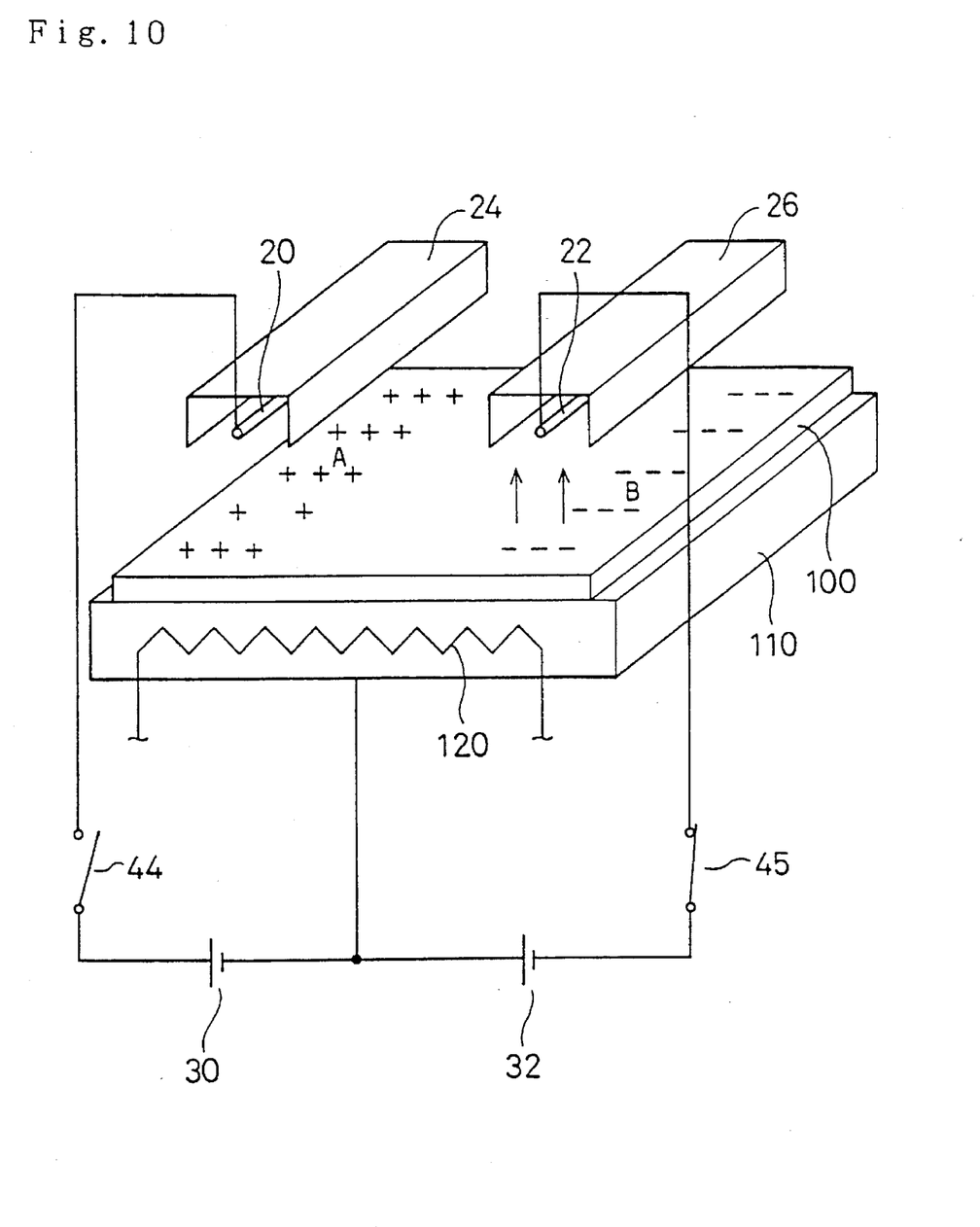
FIG. 10 is a conceptual perspective illustrating a BT treatment apparatus of a second embodiment according to the instant invention.

Difference from the BT treatment apparatus shown in FIG. 4 is that the BT treatment apparatus shown in FIG. 10 includes a first switch 44 and a second switch 45 in place of the common switch 40 which interconnects the semiconductor wafer 100, the first d.c. power source 30, and the second d.c. power source 32 with one another. In the structure of the second embodiment, the first switch 44 is interposed between the first wire 20 and the first d.c. power source 30 while the second switch 45 is interposed between the second wire 22 and the second d.c. power source 32.

Whereas the BT treatment apparatus shown in FIG. 4 simultaneously generates positive corona discharge and negative corona discharge by means of the common switch 40, the BT treatment apparatus of the second embodiment can generate positive corona discharge and negative corona discharge at different times depending upon when respective first switch 44 and second switch 45 are closed.

By way of example, the first switch 44 is first turned on (closed) to cause positive corona discharge between the first wire 20 and the semiconductor wafer 100. After a predetermined time period has elapsed, the first switch 44 is turned off (opened) to stop the positive corona discharge. The second switch 45 is then turned on to cause negative corona discharge between the second wire 22 and the semiconductor wafer 100. After a predetermined time period has elapsed, the second switch 45 is turned off to stop the negative corona discharge.

During the negative corona discharge operation, the positive charges gathering on the region A through the positive corona discharge disappear very slowly. The influence of disappearing positive charges is accordingly negligible upon condition that a time lag between positive corona discharge and negative corona discharge is significantly small.

The BT treatment apparatus of the second embodiment has effects equivalent to those of the BT treatment apparatus shown in FIG. 4. The only difference is that the BT treatment apparatus of FIG. 4 simultaneously generates positive corona discharge and negative corona discharge to save the time.

Although negative corona discharge occurs after positive corona discharge in the above description, the same effects are attained by generating positive corona discharge after negative corona discharge.

A third embodiment according to this invention is described with reference to FIG. 11, which is a perspective illustrating conceptually a BT treatment apparatus of the third embodiment.

Figure 11:
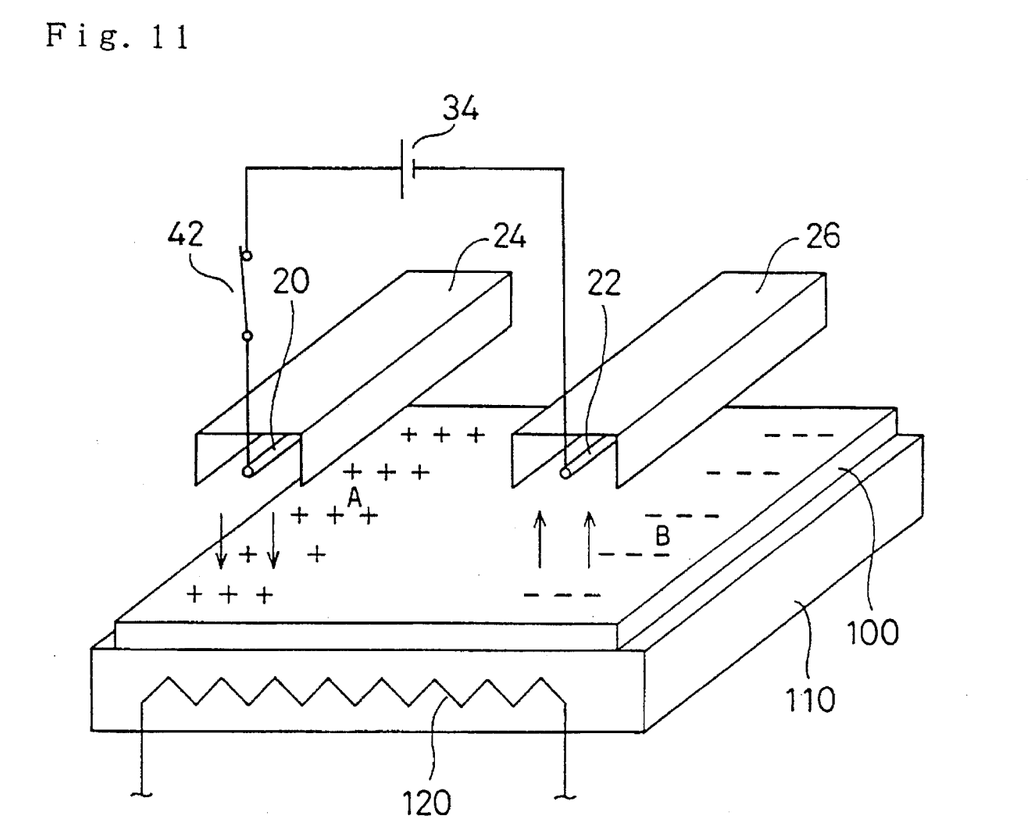
FIG. 11 is a conceptual perspective illustrating a BT treatment apparatus of a third embodiment according to the instant invention.

Difference between the BT treatment apparatus shown in FIG. 4 and the BT apparatus shown in FIG. 11, is that in the latter neither the first wire 20 nor the second wire 22 is electrically connected with the semiconductor wafer 100 but both the wires 22 and 20 are insulated from the semiconductor wafer 100 in the BT treatment apparatus shown in FIG. 11.

The first wire 20 has a first end connected with one end of a switch 42 via a connection line and a free second end. The second wire 22 has a first end connected with a negative terminal of a common d.c. power source 34 via a connection line and a free second end. A positive terminal of the d.c. power source 34 is connected to the other end of the switch 42 via a connection line. The stage 110 may be or may not be grounded.

In typical method of BT treatment for the semiconductor wafer 100 with the BT treatment apparatus shown in FIG. 11, the semiconductor wafer 110 is mounted on the stage 110. The first wire 20 and the second wire 22 are positioned to be spaced equally from the surface of the semiconductor wafer 100 by a predetermined distance.

The switch 42 is then turned on (closed as shown in FIG. 11), and the d.c. power source 34 applies a high voltage between the first wire 20 and the second wire 22. Since the distance between the first wire 20 and the surface of the semiconductor wafer 100 and that between the second wire 22 and the surface of the semiconductor wafer 100 are shorter than the distance between the first wire 20 and the second wire 22, corona discharge does not occur between the first wire 20 and the second wire 22 but occurs between the first wire 20 and the semiconductor wafer 100 and between the second wire 22 and the semiconductor wafer 100. Positive corona discharge occurs between the first wire 20 and the semiconductor wafer 100 while negative corona discharge occurs between the second wire 22 and the semiconductor wafer 100.

After a predetermined time period has elapsed, the switch 42 is turned off to stop the corona discharge.

This results in accumulation of positive charges in a region A below the first wire 20 and negative charges in a region B below the second wire 22 on the surface of the semiconductor wafer 100, as illustrated in FIG. 11.

The semiconductor wafer 100 is heated to a high temperature for a predetermined time period with the heater 120 embedded in the stage 110 shown in FIG. 11. The application of heat to the semiconductor wafer 100 by the heater 120 is then discontinued and the semiconductor wafer 100 is cooled down to room temperature. This results in +BT treatment in the region A and −BT treatment in the region B.

The BT treatment apparatus of the third embodiment has effects equivalent to those of the BT treatment apparatus shown in FIG. 4. The BT treatment apparatus of FIG. 11 requires fewer parts including only one d.c. power source, compared with the two power source BT treatment apparatus of FIG. 4.

In the BT treatment apparatus of the third embodiment, electric current output from the positive terminal of the d.c. power source 34 during the corona discharge runs through the first wire 20 via the switch 42, reaches the semiconductor wafer 100 via the atmosphere, goes back to the second wire 22 via the atmosphere, and returns to the negative terminal of the d.c. power source 34. The space between the first wire 20 and the semiconductor wafer 100 and the space between the second wire 22 and the semiconductor wafer 100 exist in the same closed circuit loop and accordingly have equivalent current densities. This makes the density of positive charges gathering in the region A on the surface of the semiconductor wafer 100 substantially equal to the density of negative charges gathering in the region B and makes the surface potential in the region A substantially equal to the surface potential in the region B.

Excessively high density of electric charges gathering on the surface of the semiconductor wafer 100, resulting from excessively high surface potential, would cause dielectric breakdown of the insulating film of the semiconductor wafer 100, and excessively low density of electric charges or surface potential, on the other hand, would not sufficiently drive movable ions in the insulating film. Accordingly, both the density of positive charges and the density of negative charges, must be restricted to be within a predetermined allowable range. However, in general it is very difficult and requires much time and labor to adjust the voltage of the d.c. power source 34 and the distance between the first and the second wires 20 and 22 and the surface of the semiconductor wafer 100 in order to restrict both the density of positive charges and that of negative charges to be within the predetermined allowable range.

The BT treatment apparatus of the third embodiment results in the density of negative charges being substantially equal to the density of positive charges. Adjustment of the third voltage of the d.c. power source 34 and the distance between the first wire 20 and the surface of the semiconductor wafer 100 in order to restrict the density of positive charges within a predetermined allowable range naturally sets the density of negative charges within the predetermined allowable range. The BT treatment apparatus of the third embodiment does not require any specific adjustment for restricting the density of negative charges within the predetermined allowable range, thus reducing the time and labor required for making such an adjustment.

A fourth embodiment according to the invention is described with reference to FIG. 12, which is a perspective that illustrates conceptually a BT treatment apparatus of the fourth embodiment. The BT treatment apparatus shown in FIG. 4 differs from the BT treatment apparatus of FIG. 12 in that the latter includes a common d.c. power source 34 in place of the first d.c. power source 30 and the senond d.c. power source 32, as well as a first switch 46 and a second switch 47 in place of the common switch 40 which interconnects the semiconductor wafer 100, the first d.c. power source 30, and the second d.c. power source 32 with one another.

The first switch 46 has terminal (a) connected with one end of the first wire 20, terminal (b) connected with the rear face of the stage 110, and terminal (c) connected with a positive terminal of the d.c. power source 34. One end of the movable switch bar of the first switch 46 is fixed to the terminal (c) while the other end is switched between the terminal (a) and the terminal (b). The second switch 47 has terminal (d) connected with the rear face of the stage 110, terminal (e) connected with one end of the second wire 22, and terminal (f) connected with a negative terminal of the d.c. power source 34. One end of the switch bar of the second switch 47 is fixed to the terminal (f) while the other end is switched between the terminal (d) and the terminal (e).

Figure 12:
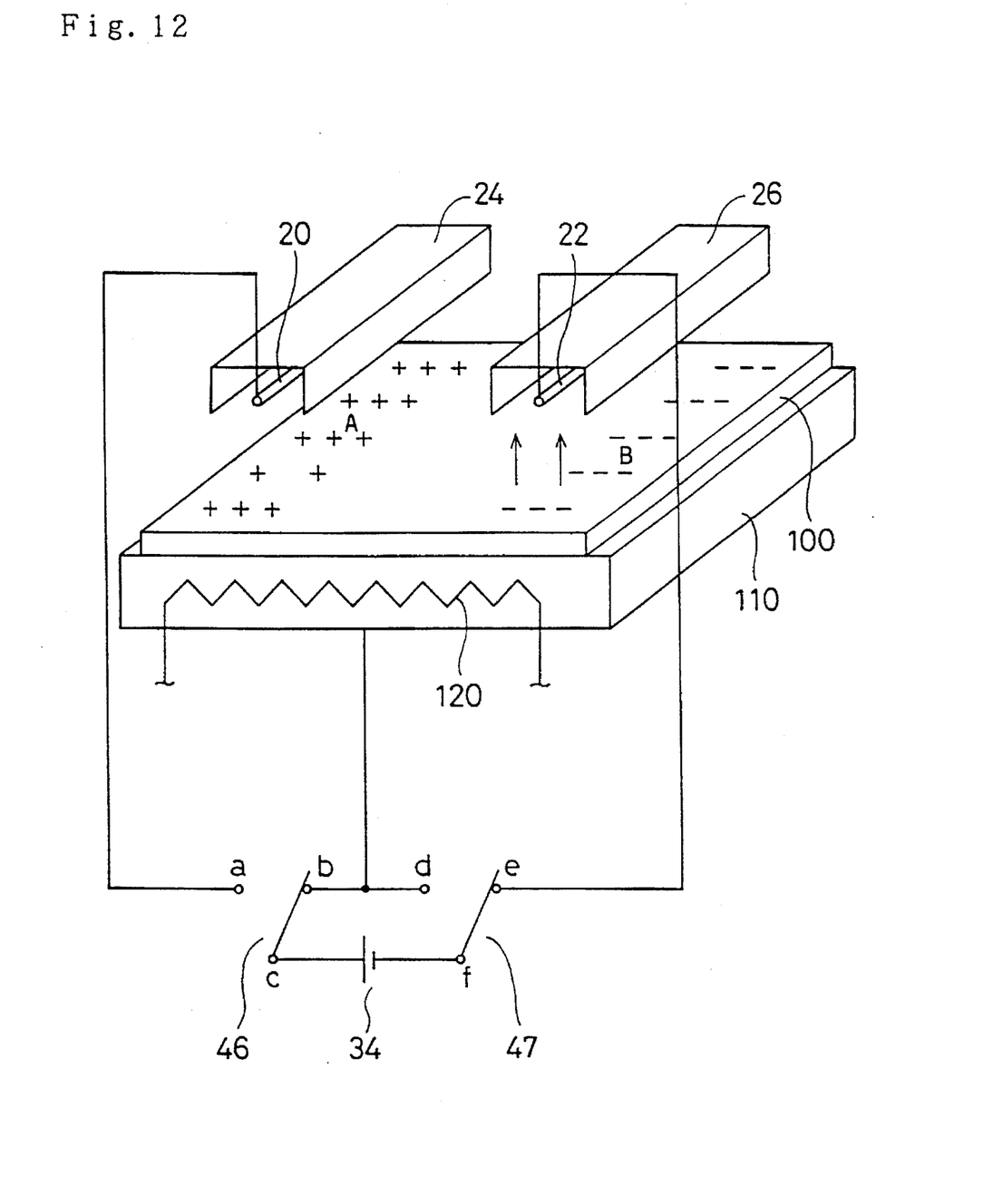
FIG. 12 is a conceptual perspective illustrating a BT treatment apparatus of a fourth embodiment according to the instant invention.

A typical method of BT treatment for the semiconductor wafer 100 with the BT treatment apparatus shown in FIG. 12 begins with mounting semiconductor wafer 100 on the upper surface of stage 110. The first wire 20 and the second wire 22 are positioned above wafer 100 and are spaced equally from the upper surface of the semiconductor wafer 100 by a predetermined distance.

While the switch bar of the first switch 46 is connected to the terminal (a) and the switch bar of the second switch 47 to the terminal (d), the d.c. power source 34 applies a positive high voltage between the first wire 20 and the semiconductor wafer 100. This results in positive corona discharge between the first wire 20 and the semiconductor wafer 100. After a predetermined time period has elapsed, the switch bar of the first switch 46 is placed between terminals (a) and (b) and the switch bar of the second switch 47 is placed between terminals (d) and (e) to stop the positive corona discharge.

At a next step, while the switch bar of the first switch 46 is connected to the terminal (b) and the switch bar of the second switch 47 is connected to the terminal (e) as shown in FIG. 12, the d.c. power source 34 applies a negative high voltage between the second wire 22 and the semiconductor wafer 100. This results in negative corona discharge between the second wire 22 and the semiconductor wafer 100. After a predetermined time period has elapsed, the switch bar of the first switch 46 is placed between terminals (a) and (b) and the switch bar of the second switch 47 is placed between terminals (d) to stop the negative corona discharge.

This results in accumulation of positive charges in a region A below the first wire 20 and negative charges in a region B below the second wire 22 on the upper surface of the semiconductor wafer 100, as illustrated in FIG. 12.

The semiconductor wafer 100 is heated to high temperatures for a predetermined time period by energizing the heater 120 embedded in the stage 110 shown in FIG. 12. The application of heat to the semiconductor wafer 100 by the heater 120 is then discontinued and the semiconductor wafer 100 is cooled down to room temperature. This results in +BT treatment in the region A and −BT treatment in the region B.

The BT treatment apparatus of the fourth embodiment has effects equivalent to those of the BT treatment apparatus shown in FIG. 4. While the BT treatment apparatus of FIG. 4 generates positive and negative corona discharges simultaneously to save time, the BT treatment apparatus of FIG. 4 requires fewer parts including only one d.c. power source.

Although the negative corona discharge is caused after the positive corona discharge in the above description, the same effects are attained by generating positive corona discharge after negative corona discharge.

Upon condition that the switch bar of the first switch 46 is connected to the terminal (a) and the switch bar of the second switch 47 to the terminal (e), the BT treatment apparatus of the fourth embodiment works in the same manner as the BT treatment apparatus shown in FIG. 11.

In the first through the fourth embodiments described above, there is only one region of +BT treatment (the region A), and only one region of −BT treatment (the region B). The BT treatment apparatus may, however, have three or more wires to execute +BT treatment or −BT treatment or both in a plurality of regions.

Although the semiconductor wafer 100 is heated after completion of corona discharge in the above embodiments, the semiconductor wafer 100 may be heated during the corona discharge operation.

There may be many other modifications, alterations, and changes without departing from the scope or spirit of essential characteristics of the invention. It is thus clearly understood that the above embodiments are only illustrative and not restrictive in any sense. The scope and spirit of the present invention are limited only by the terms of the appended claims.

What is claimed is:

1. A method of executing bias temperature treatment on a semiconductor wafer, said method comprising:

step (a) of supporting said semiconductor wafer at a selected position:

step (b) of arranging a first wire and a second wire respectively spaced by a distance from a surface of said semiconductor wafer;

step (c) of simultaneously applying a positive d.c. voltage between said first wire and said semiconductor wafer and applying a negative d.c. voltage between said second wire and said semiconductor wafer, so as to generate said positive corona discharge between said first wire and said semiconductor wafer and said negative corona discharge between said second wire and said semiconductor wafer simultaneously, to thereby form a region of positive charges and a region of negative charges on the semiconductor wafer through said positive corona discharge and said negative corona discharge, respectively; and step (d) of heating said semiconductor wafer.

2. A method in accordance with claim 1, wherein said step (d) is executed simultaneously with said step (c).

3. A method of executing bias temperature treatment on a semiconductor wafer, said method comprising:

step (a) of supporting said semiconductor wafer at a selected position;

step (b) of arranging a first wire and a second wire respectively spaced by a distance from a surface of said semiconductor wafer;

step (c) of applying a d.c. voltage between said first wire and said second wire to generate said positive corona discharge between said first wire and said semiconductor wafer and said negative corona discharge between said second wire and said semiconductor wafer simultaneously, to thereby form a region of positive charges and a region of negative charges on the semiconductor wafer through said positive corona discharge and said negative corona discharge, respectively; and step (d) of heating said semiconductor wafer.

4. A method in accordance with claim 3, wherein said step (d) is executed simultaneously with said step (c).

* * * * *